(12) United States Patent
Yamase et al.

(10) Patent No.: US 8,542,141 B2
(45) Date of Patent: Sep. 24, 2013

(54) ANALOG-TO-DIGITAL CONVERSION DEVICE AND ANALOG-TO-DIGITAL CONVERSION METHOD

(75) Inventors: Tomoyuki Yamase, Tokyo (JP); Hidemi Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 62 days.

(21) Appl. No.: 13/249,486

(22) Filed: Sep. 30, 2011

(65) Prior Publication Data
US 2012/0112937 A1    May 10, 2012

(30) Foreign Application Priority Data
Nov. 10, 2010    (JP) .................................. 2010-251383

(51) Int. Cl.
*H03M 1/12*    (2006.01)
(52) U.S. Cl.
USPC .......................................... 341/155; 341/156
(58) Field of Classification Search
USPC .......................... 341/155, 156, 139, 120, 172
See application file for complete search history.

(56) References Cited

U.S. PATENT DOCUMENTS 8,107,340 B2 *   1/2012   Lin et al. ..................... 369/59.21
2009/0009373 A1 *   1/2009   Yoshinaga .................... 341/143

FOREIGN PATENT DOCUMENTS

| JP | 2001326575 A | 11/2001 |
| JP | 2003101411 A | 4/2003 |
| JP | 2004214905 A | 7/2004 |
| JP | 2005109963 A | 4/2005 |
| JP | 2008061167 A | 3/2008 |
| JP | 2008177639 A | 7/2008 |

OTHER PUBLICATIONS

Japanese Office Action for JP2010-251383 mailed on Nov. 6, 2012.

* cited by examiner

*Primary Examiner* — Joseph Lauture

(57) ABSTRACT

An analog-to-digital conversion device which converts an analog input signal into a digital signal and output it includes a signal characteristic detection unit for detecting a predetermined characteristic of the input signal; a control signal generation unit for setting a resolution based on the signal characteristic detected by the signal characteristic detection unit, generating a control signal that indicates only an operation required for performing the analog-to-digital conversion at the resolution, and outputting it; and an analog-to-digital conversion unit for restricting the operation based on the control signal and converting the input signal into the digital signal at the set resolution.

20 Claims, 11 Drawing Sheets

ANALOG-TO-DIGITAL CONVERSION DEVICE AND ANALOG-TO-DIGITAL CONVERSION METHOD

This application is based upon and claims the benefit of priority from Japanese Patent Application No. 2010-251383, filed on Nov. 10, 2010, the disclosure of which is incorporated herein in its entirety by reference.

TECHNICAL FIELD

The present invention relates to an analog-to-digital conversion device which converts an analog signal into a digital signal and an analog-to-digital conversion method.

BACKGROUND ART

An analog-to-digital converter (ADC) which converts an analog signal into a digital signal in order to perform various processes in a digital circuit or the like is widely used for an LSI (Large Scale Integration) or the like in a wire and/or wireless electronic device.

By the way, the ADC consumes much electric power and most of the electric power consumed in the LSI is consumed in the ADC. Accordingly, for example, in an electronic device such as a wireless portable terminal or the like, in order to realize a long-time battery operation, low power consumption is strongly required. For this reason, a technology for suppressing the electric power consumed in the ADC has been developed.

In Japanese Patent Application Laid-Open No. 2003-101411, a parallel type ADC which has a reference voltage generation circuit for outputting m reference voltages based on bit precision of a digital output signal, n comparators, and an encoder for encoding the outputs of n comparators and outputting a digital output signal is proposed. The number n of the comparators is set to a number smaller than the number m of the reference voltages and whereby a circuit scale is reduced. Therefore, the power consumption can be reduced.

In Japanese Patent Application Laid-Open No. 2004-214905, a variable resolution type ADC is proposed. The variable resolution type ADC outputs a digital output signal is obtained by synthesizing the digital signals outputted from conversion stages that are arranged at a subsequent stage of a sample hold circuit and connected in cascade. The sample hold circuit includes sample hold units, the number of which is determined according to the required resolution, and each sample hold unit is operated or stopped separately according to the resolution. As a result, the electric power consumed by the sample hold unit that is stopped can be reduced.

Japanese Patent Application Laid-Open No. 2008-177639 discloses a technology that a first resolution applied when a first signal for synchronization establishment is converted into a digital signal and a second resolution applied when a second signal including reception information is converted into the digital signal are switched. Additionally, an ADC in which the power consumption when performing the conversion into the digital signal at the second resolution is greater than the power consumption when performing the conversion into the digital signal at the first resolution is provided. Until the synchronization is established based on the first signal, the conversion into the digital signal is performed at the first resolution. As a result, the power consumption can be suppressed until the synchronization is established.

In Japanese Patent Application Laid-Open No. 2010-166447, a pipeline type ADC in which a plurality of residual calculation stages that are connected in cascade are provided and the resolution of the residual calculation stages other than the last stage can be changed is proposed. Control is performed so that the resolution in each residual calculation stage is increased when a high S/N (Signal/Noise) ratio is required and the resolution is lowered when the electric power is reduced at the sacrifice of the S/N ratio. As a result, a time average electric power can be reduced.

However, the inventions described in the above-mentioned patent documents have the following problems. Namely, in the parallel type ADC disclosed in Japanese Patent Application Laid-Open No. 2003-101411, because the number n of the comparators is set to a number smaller than the number m of the reference voltages, it is difficult to convert a full scale analog signal into a digital signal at high resolution. Therefore, a problem in which while performing the conversion into the digital signal at a resolution according to a signal characteristic of the analog signal that is a conversion object, the power consumption cannot be reduced occurs.

In the variable resolution type ADC disclosed in Japanese Patent Application Laid-Open No. 2004-214905, variable resolution is used and each of the plurality of sample hold units used in the sample hold circuit is separately operated or stopped according to the resolution. However, a configuration in which each conversion stage connected to the sample hold circuit always operates is used. Therefore, a problem in which the power consumption cannot be sufficiently suppressed occurs.

In the invention disclosed in Japanese Patent Application Laid-Open No. 2008-177639, until the synchronization is established based on the first signal with the S/N ratio greater than the S/N ratio of the second signal, the first signal is converted into the digital signal at the first resolution smaller than the second resolution and whereby, the power consumption can be reduced until the synchronization is established. However, a problem in which the power consumption cannot be reduced after the synchronization has been established occurs.

In the invention of Japanese Patent Application Laid-Open No. 2010-166447, in order to reduce the power consumption, a control in which the resolution in each residual calculation stage is increased when a high S/N ratio is required and the resolution is lowered when the power consumption is reduced at the sacrifice of the S/N ratio is performed. However, this control has a problem in which all the residual calculation stages operate independently of the resolution and the power consumption cannot be sufficiently reduced.

SUMMARY

A main object of the present invention is to provide an analog-to-digital conversion device which can perform conversion into a digital signal at a resolution according to a signal characteristic of an analog signal that is a conversion object and whose power consumption at the time of the conversion can be reduced and an analog-to-digital conversion method.

An analog-to-digital conversion device which converts an analog input signal into a digital signal and output it includes a signal characteristic detection unit for detecting a predetermined characteristic of the input signal; a control signal generation unit for setting a resolution based on the signal characteristic detected by the signal characteristic detection unit, generating a control signal that indicates only an operation required for performing the analog-to-digital conversion at the resolution, and outputting it; and an analog-to-digital conversion unit for restricting the operation based on the control signal and converting the input signal into the digital signal at the set resolution.

BRIEF DESCRIPTION OF THE DRAWINGS

Exemplary features and advantages of the present invention will become apparent from the following detailed description when taken with the accompanying drawings in which.

EXEMPLARY EMBODIMENT

First Exemplary Embodiment

Figure 1:
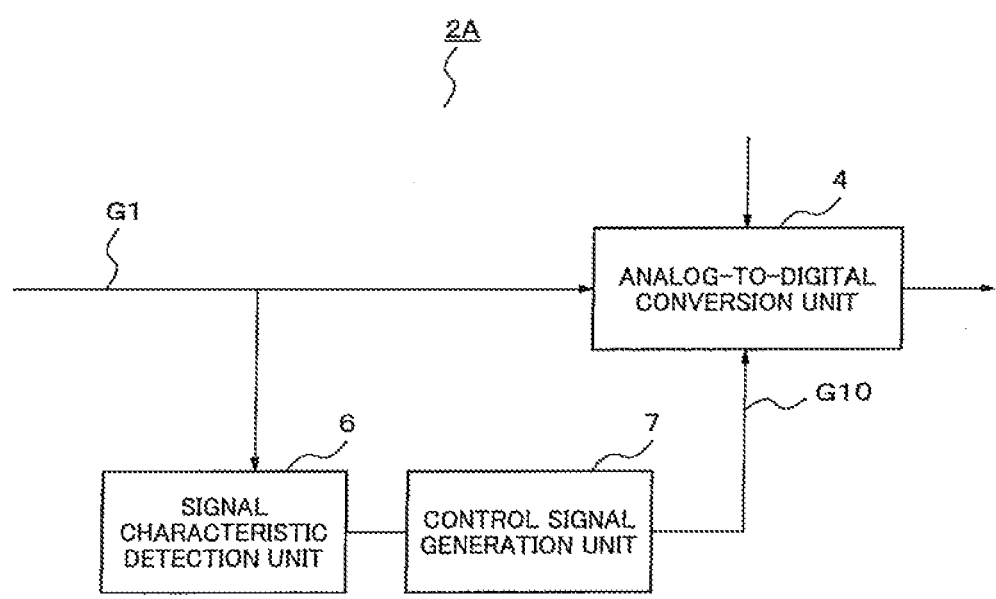
FIG. 1 is a block diagram of an analog-to-digital conversion device according to a first exemplary embodiment of the present invention.

A first exemplary embodiment of the present invention will be described. FIG. 1 is a block diagram of an analog-to-digital conversion device 2A according to a first exemplary embodiment of the present invention.

The analog-to-digital conversion device 2A—includes a signal characteristic detection unit 6, a control signal generation unit 7, and an analog-to-digital conversion unit 4. The signal characteristic detection unit 6 detects a characteristic of an input signal G1. The control signal generation unit 7 sets a resolution based on the signal characteristic detected by the signal characteristic detection unit 6, generates a control signal G10 that indicates only an operation required for performing an analog-to-digital conversion at the resolution, and outputs the control signal G10. The operation of the analog-to-digital conversion unit 4 is restricted by the control signal G10 and the analog-to-digital conversion unit 4 converts the input signal G1 into the digital signal at the set resolution.

Namely, the signal characteristic detection unit 6 detects the signal characteristic of the input signal G1 and outputs this detection result to the control signal generation unit 7.

The control signal generation unit 7 sets the resolution of the analog-to-digital conversion based on the signal characteristic from the signal characteristic detection unit 6 and outputs information for specifying a function required for achieving the resolution to the analog-to-digital conversion unit 4 as the control signal.

In the analog-to-digital conversion unit 4, a partial operation of the function can be changed and the resolution can be changed by performing the partial operation of this function. The partial operation of the function of the analog-to-digital conversion unit 4 is performed based on the control signal. Accordingly, the analog-to-digital conversion unit 4 performs the partial operation at the resolution according to the signal characteristic of the input signal G1 that is the conversion object and whereby, the power consumed by a stop function can be reduced.

Second Exemplary Embodiment

Figure 2:
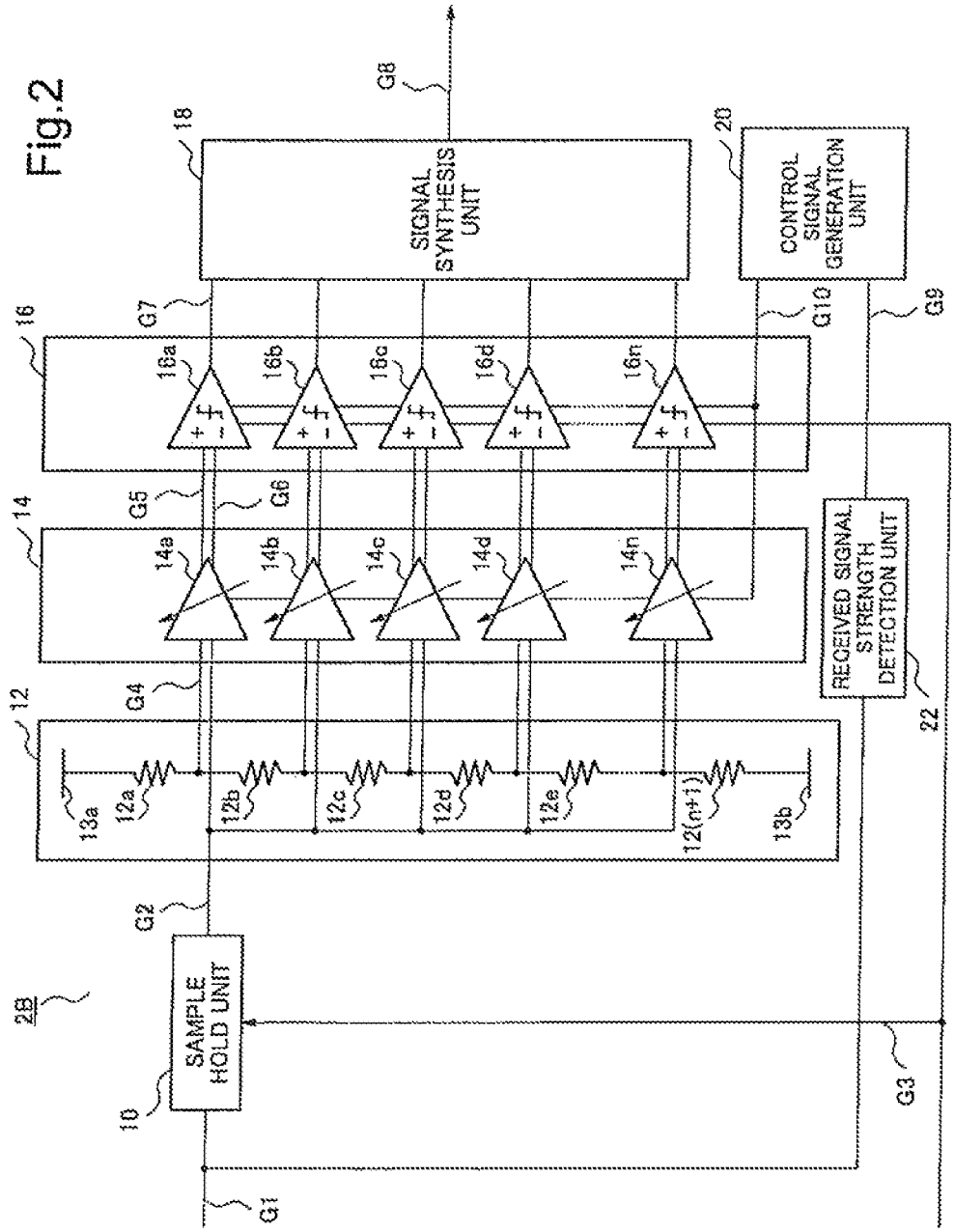
FIG. 2 is a block diagram of a parallel type analog-to-digital conversion device according to a second exemplary embodiment of the present invention.

A second exemplary embodiment of the present invention will be described. FIG. 2 is a block diagram of a parallel type analog-to-digital conversion device 2B according to the second exemplary embodiment of the present invention.

This analog-to-digital conversion device 2B includes a sample hold unit 10, a reference voltage generation unit 12 including a plurality of resistors 12a to 12(n+1), a preamplifier unit 14 including a plurality of preamplifiers 14a to 14n, a comparator unit 16 including a plurality of comparators 16a to 16n, a signal synthesis unit 18, a control signal generation unit 20, and a received signal strength detection unit (signal characteristic detection unit) 22. Further, the analog-to-digital conversion unit is composed of the reference voltage generation unit 12, the preamplifier unit 14, and the comparator unit 16.

In the sample hold unit 10, a sample mode and a hold mode that can be switched in synchronization with a clock signal G3 are provided. In the sampling mode, the input signal G1 that is an analog signal is sampled and in the hold mode, the sampled input signal G1 is outputted to the preamplifier unit 14 as a sampling signal G2 for a hold time set in advance. Further, the hold time is equal to a time required for performing the analog-to-digital conversion process in the preamplifier unit 14, the comparator unit 16, and the like that are provided in the subsequent stage or a time that is appropriately longer than that time.

In the reference voltage generation unit 12, the plurality of resistors 12a to 12(n+1) are connected in series between a high potential side terminal 13a and a low potential side terminal 13b and an electric potential difference between the high potential side terminal 13a and the low potential side terminal 13b is divided according to the resistance value. The divided voltages are outputted to the preamplifier unit 14 as a reference voltage signal G4.

The preamplifier unit 14 includes the plurality of preamplifiers 14a to 14n. The sampling signal G2 from the sample hold unit 10 and the reference voltage signal G4 from the reference voltage generation unit 12 are inputted to each of the preamplifiers 14a to 14n. Further, the reference voltage signals G4 inputted to the preamplifiers 14a to 14n are different from each other.

Each of the preamplifiers 14a to 14n outputs a voltage obtained by amplifying the voltage difference between the sampling signal G2 and the reference voltage signal G4 as preamplifier output signals G5 and G6. At this time, two signals of the preamplifier output signals G5 and G6 which have the same amplitude and have opposite polarities to each other are outputted.

Hereinafter, these signals are described as a positive preamplifier output signal G5 and a negative preamplifier output signal G6.

However, it is not necessarily mean that the positive preamplifier output signal G5 is a signal having a positive value and the negative preamplifier output signal G6 is a signal having a negative value.

The positive preamplifier output signal G5 and the negative preamplifier output signal G6 from the preamplifier unit 14 are inputted to each of the comparators 16a to 16n of the comparator unit 16. A magnitude comparison between the positive preamplifier output signal G5 and the negative preamplifier output signal G6 is performed and a result of the comparison is outputted to the signal synthesis unit 18 as a comparison result signal G7.

The comparison result signal G7 may have a one-bit binary data of "1" when the voltage of the terminal of each of the comparators 16a to 16n to which the positive preamplifier output signal G5 is inputted is greater than the voltage of the terminal of each of the comparators 16a to 16n to which the negative preamplifier output signal G6 is inputted and it may have a one-bit binary data of "0" in a reverse case.

Further, in each of the comparators 16a and 16n, an output timing of each comparison result signal G7 is adjusted in synchronization with the clock signal G3 and additionally, a timing of the switching between two modes of the sample hold unit 10 synchronizes with the output timing of each comparison result signal G7.

The signal synthesis unit 18 synthesizes all the comparison result signals G7 from the comparators 16a to 16n and outputs the processing result as an output signal G8.

The input signal G1 is inputted to the received signal strength detection unit 22. The received signal strength detection unit 22 detects the signal characteristic of the input signal G1. Signal strength is one example of the signal characteristic. In an explanation for this exemplary embodiment, the signal strength is taken as the signal characteristic.

The signal strength detected by the received signal strength detection unit 22 is converted into binary data and it is outputted to the control signal generation unit 20 as a characteristic signal G9. Further, the number of bits of the characteristic signal G9 is not limited in particular. Furthermore, the received signal strength detection unit 22 does not necessarily always operate and it may operate on a predetermined cycle.

The control signal generation unit 20 determines the resolution based on the characteristic signal G9 from the received signal strength detection unit 22 and specifies the preamplifiers and the comparators that are operated among the preamplifiers 14a to 14n and the comparators 16a to 16n based on this resolution. Namely, an operation instruction or a stop instruction is generated for each of the preamplifiers 14a to 14n and each of the comparators 16a to 16n.

The operation instruction and the stop instruction are outputted to each of the preamplifiers 14a to 14n and each of the comparators 16a to 16n in parallel as the control signal G10. Accordingly, when the preamplifiers 14a to 14n and the comparators 16a to 16n receive the control signal G10, each of them operates or stops based on this control signal G10.

When all the preamplifiers 14a to 14n and all the comparators 16a to 16n operate, the maximum resolution can be obtained but the maximum power is consumed.

On the other hand, when some of the preamplifiers 14a to 14n and some of the comparators 16a to 16n stop, the resolution is lowered but the power consumption can be suppressed according to the number of the preamplifiers and the comparators that stop.

Here, for example, it is assumed that in a normal state, the preamplifiers 14a to 14m and the comparators 16a to 16m are set to be operated and the preamplifiers 14($m$+1) to 14n and the comparators 16($m$+1) to 16n are set to be stopped.

In this state, when the resolution is lowered because the strength of the input signal is large, the preamplifiers 14a to 14$m\_1$ and the comparators 16a to 16$m\_1$ are operated. Where, $m\_1 > m$.

On the other hand, when the resolution is increased because the strength of the input signal is small, the preamplifiers 14a to 14$m\_2$ and the comparators 16a to 16$m\_2$ are operated. Further, $m\_1 > m > m\_2$.

Because the electric power is not supplied to the preamplifiers and the comparators that are in a stop state among the preamplifiers 14a to 14n and the comparators 16a to 16n, the power consumption of the analog-to-digital conversion device 2B can be reduced according to the resolution, in other words, according to the signal characteristic of the input signal.

Additionally, when some of the preamplifiers and some of the comparators stop, the number of the bits of the output signals G8 changes. Therefore, when the resolution is set to the low resolution, the load on the signal processing in the signal synthesis unit 18 is eased and whereby, the power consumption of the signal synthesis unit 18 can be reduced.

Figure 3:
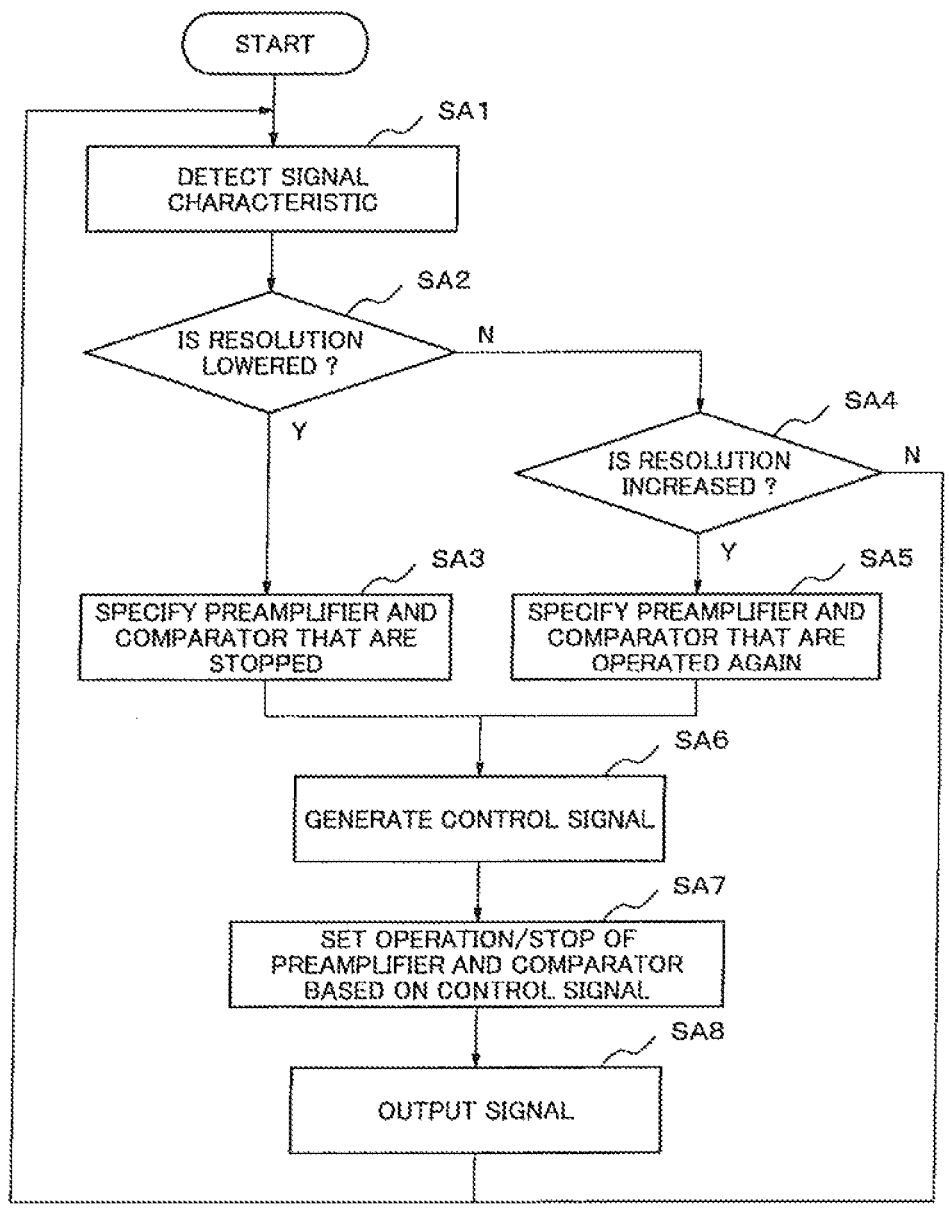
FIG. 3 is a flowchart of an analog-to-digital conversion device according to a second exemplary embodiment.

Next, the operation of the above-mentioned analog-to-digital conversion device 2B will be described with reference to a flowchart shown in FIG. 3.

When the process is started, the received signal strength detection unit 22 detects the signal characteristic of the input signal G1 (step SA1). This detection result is inputted to the control signal generation unit 20 as the characteristic signal G9.

The control signal generation unit 20 determines whether to lower the resolution based on the inputted characteristic signal G9 (step SA2). When the resolution is lowered, the process proceeds to step SA3 but when the resolution is not lowered, the process proceeds to step SA4.

When the process proceeds to step SA3, the control signal generation unit 20 specifies the preamplifiers and the comparators that have to be stopped among the preamplifiers 14a to 14n and the comparators 16a to 16n in order to lower the resolution.

When it is determined that the resolution is not lowered in step SA2, the control signal generation unit 20 determines whether to increase the resolution (step SA4).

When it is determined that the resolution is not increased, the process returns to step SA1 because the current resolution is maintained. However, when the resolution is increased, the preamplifiers and the comparators that have to be operated again are specified among the preamplifiers 14a to 14n and the comparators 16a to 16n (step SA5).

The control signal generation unit 20 generates the control signal G10 including an operation/stop instruction for the preamplifiers and the comparators specified in step SA3 and step SA5 among the preamplifiers 14a to 14n and the comparators 16a to 16n (step SA6).

Each of the preamplifiers 14a to 14n and the comparators 16a to 16n is operated or stopped based on this control signal G10 (step SA7). In this way, each of the preamplifiers 14a to 14n and the comparators 16a to 16n is operated or stopped. The obtained comparison result signals G7 are synthesized in the signal synthesis unit 18 and the synthesized signal is outputted as the output signal G8 in a digital form (step SA8).

As a result, the resolution is set according to the signal characteristic (signal strength) of the input signal. In order to carry out the digital conversion at this resolution, some of the preamplifiers and some of the comparators in the analog-to-digital conversion unit are stopped. Therefore, the power consumption can be reduced while ensuring the required resolution.

Third Exemplary Embodiment

Next, a third exemplary embodiment of the present invention will be described. Further, the same reference numbers are used for the units having the same function as the second exemplary embodiment and the description of the unit will be omitted appropriately.

In the first exemplary embodiment, the received signal strength detection unit detects the signal strength of the input signal, some of the preamplifiers and some of the comparators are stopped according to this signal strength and whereby, the power consumption is reduced. Meanwhile, in this exemplary embodiment, an eye monitor unit is provided instead of the received signal strength detection unit to detect the signal characteristic of the input signal.

Figure 4:
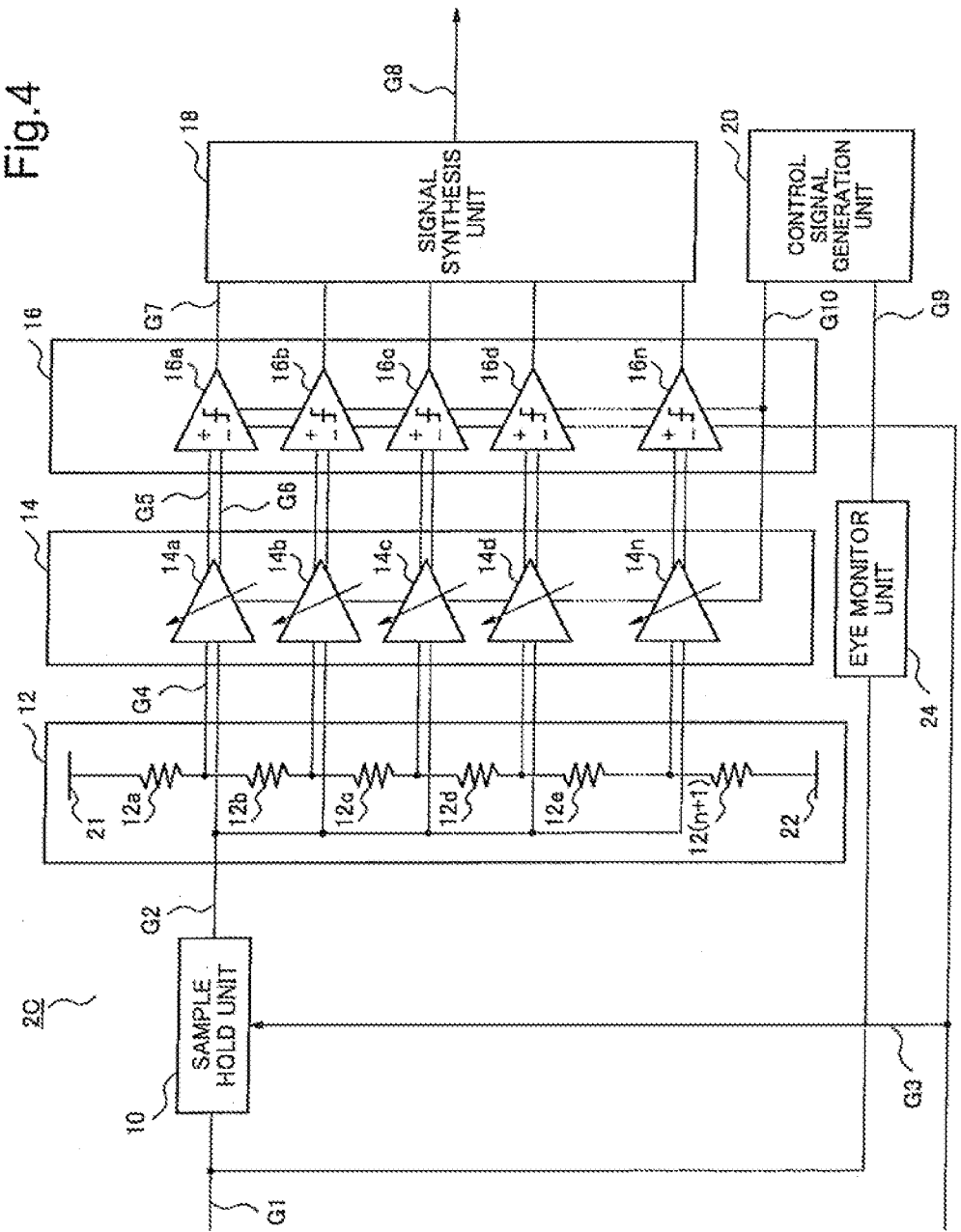
FIG. 4 is a block diagram of a parallel type analog-to-digital conversion device according to a third exemplary embodiment of the present invention.

FIG. 4 is a block diagram of a parallel type analog-to-digital conversion device 2C according to the third exemplary embodiment of the present invention. This analog-to-digital conversion device 2C includes the sample hold unit 10, the reference voltage generation unit 12 that is composed of the plurality of resistors 12a to 12(n+1), the preamplifier unit 14 including the plurality of preamplifiers 14a to 14n, the comparator unit 16 including the plurality of comparators 16a to 16n, the signal synthesis unit 18, the control signal generation unit 20, and an eye monitor unit (signal characteristic detection unit) 24.

Further, the analog-to-digital conversion unit is composed of the reference voltage generation unit 12, the preamplifier unit 14, and the comparator unit 16. Namely, in the third exemplary embodiment, the eye monitor unit 24 is used instead of the received signal strength detection unit used in the second exemplary embodiment. This is a difference from the second exemplary embodiment.

When the input signal G1 has a random pattern, the signal degradation due to wavelength dispersion occurs. Accordingly, the amount of signal degradation is detected by the eye monitor unit 24. The detected amount of signal degradation is converted into binary data and the binary data is outputted to the control signal generation unit 20 as the characteristic signal G9. Further, the number of bits of the characteristic signal G9 is not limited in particular.

The control signal generation unit 20 generates the control signal G10 with which when the amount of degradation of the input signal G1 is small, the number of the preamplifiers and the comparators that are stopped is increased so as to lower the resolution and when the amount of degradation is large, the number of the preamplifiers and the comparators that are stopped is decreased so as to increase the resolution.

The determination result is outputted to each of the preamplifiers 14a to 14n and each of the comparators 16a to 16n as the control signal G10.

As a result, the resolution is set according to the signal characteristic (amount of signal degradation) of the input signal. In order to carry out the digital conversion at this resolution, some of the preamplifiers and some of the comparators in the analog-to-digital conversion unit are stopped. Therefore, the power consumption can be reduced while ensuring the required resolution.

Fourth Exemplary Embodiment

Next, a fourth exemplary embodiment of the present invention will be described. Further, the same reference numbers are used for the units having the same function as the second exemplary embodiment and the description of the unit will be omitted appropriately. In the second and third exemplary embodiments, the parallel type analog-to-digital conversion device has been described. In contrast, in this exemplary embodiment, the analog-to-digital conversion is carried out by using a successive approximation analog-to-digital conversion device.

Figure 5:
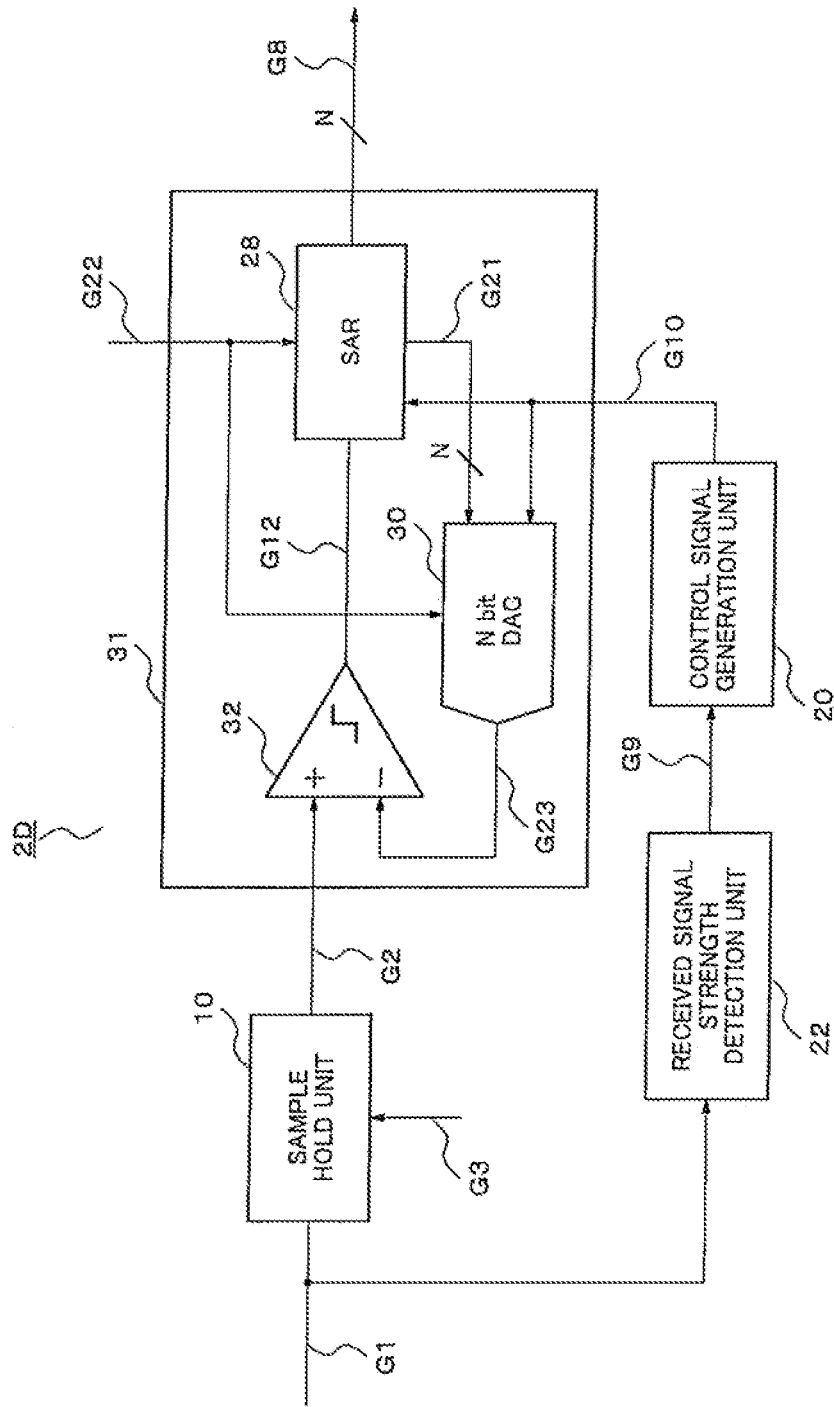
FIG. 5 is a block diagram of an analog-to-digital conversion device using a received signal strength detection unit according to a fourth exemplary embodiment of the present invention.

FIG. 5 is a block diagram of an analog-to-digital conversion device 2D according to the fourth exemplary embodiment. The analog-to-digital conversion device 2D includes the sample hold unit 10, a successive approximation ADC (analog-to-digital conversion unit) 31, the control signal generation unit 20, and the received signal strength detection unit (signal characteristic detection unit) 22.

The successive approximation ADC 31 includes a successive approximation register (SAR) 28, a digital-to-analog converter (DAC) 30 that operates as a reference voltage generation unit, and a comparator 32.

The SAR 28 includes an N-bit register and has a function to sequentially set a value of each bit of the register from the higher order bit in synchronization with a clock signal G22 for comparison according to a procedure described later and output the set value. Here, when a comparison result signal G12 is inputted to the SAR 28 from the comparator 32, the SAR 28 outputs the register value to the DAC 30 as a register signal G21 in synchronization with the clock signal G22 for comparison.

Further, the clock signal G22 for comparison and the clock signal G3 have a relationship in which a period of the clock signal G22 for comparison is equal to a period obtained by dividing a period of the clock signal G3 by (N bit) (N is a positive integer).

This is because the SAR 28 and the DAC 30 are an N bit register and an N bit digital-to-analog converter, respectively. Accordingly, the present invention is not limited to the number N of bits with respect to the SAR 28 and the DAC 30.

The DAC 30 outputs an analog reference signal G23 corresponding to the inputted register signal G21 to the comparator 32.

The comparator 32 compares the sampling signal G2 with the reference signal G23 and outputs a comparison result signal G12 according to the comparison result.

A process in which a signal flows through the units, SAR 28→DAC 30→comparator 32, is defined as one cycle of the process. This cycle is repeated until all the values of the N-bit register in the SAR 28 are determined. When all the values of the N-bit register are determined, the maximum resolution is obtained.

Accordingly, the control signal generation unit 20 calculates the resolution based on the signal characteristic (signal strength) of the input signal G1 detected by the received signal strength detection unit 22 and determines the number of cycles required for performing the digital conversion at the calculated resolution. The control signal G10 including the determined number of cycles is outputted to the SAR 28 and the DAC 30.

Figure 6:
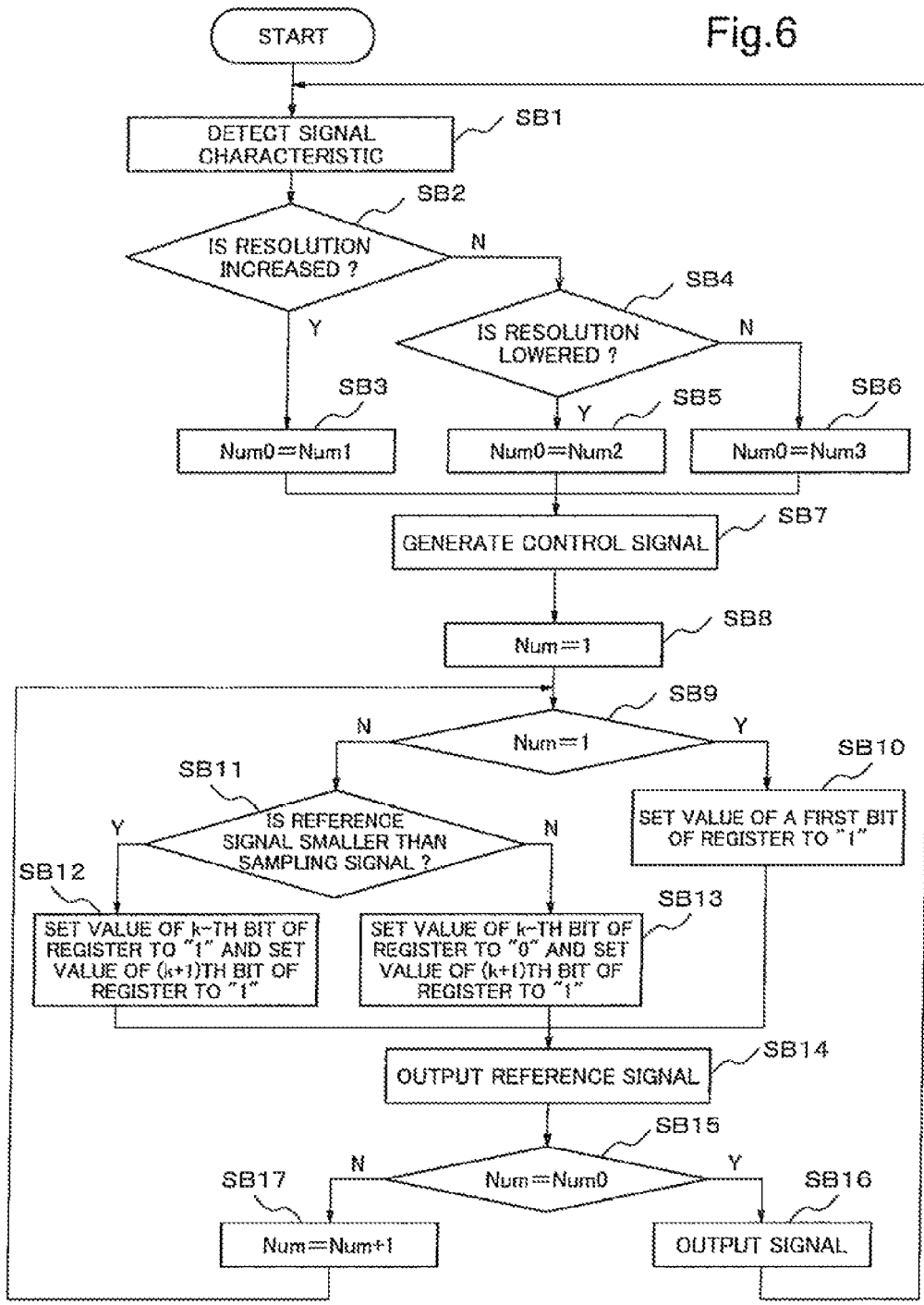
FIG. 6 is a flowchart of an analog-to-digital conversion device according to a fourth exemplary embodiment.

The operation of the analog-to-digital conversion device 2D will be explained with reference to a flowchart shown in FIG. 6. Further, for ease of the explanation, it is assumed that in the analog-to-digital conversion device 2D, the resolution has a full-scale of 1 V and it is normally set to 0.5 V. Hereinafter, this setting voltage is described as a normal strength, this resolution is described as a normal resolution, and the number of cycles in this setting is described as a normal cycle number Num3.

Additionally, the number of cycles repeated until all the values of the register in the SAR 28 are determined is described as a maximum cycle number Num_max (1<Num3<Num_max). When the cycle is repeated up to the maximum cycle number Num_max of times, the maximum resolution can be obtained.

First, the received signal strength detection unit 22 detects the signal characteristic and outputs this as the characteristics signal G9 (step SB1).

The control signal generation unit 20 determines whether the signal strength of the input signal G1 is greater than the normal strength based on the characteristic signal G9 (step SB2). At this time, when the signal strength of the input signal G1 is greater than the normal strength, the cycle number is calculated so as to set the resolution to a resolution lower than the normal resolution.

The calculated cycle number Num1 (1<Num1<Num3) is set to an object cycle number Num0 (step SB3). When the characteristic signal G9 indicates that the strength of the input signal G1 is not greater than the normal strength, the process proceeds to step SB4.

When the characteristic signal G9 indicates that the strength of the input signal G1 is not greater than the normal strength, it is determined whether the characteristic signal G9 indicates that the strength of the input signal G1 is smaller than the normal strength (step SB4).

When the characteristic signal G9 indicates that the strength of the input signal G1 is smaller than the normal strength, the cycle number is calculated so as to set the resolution to a resolution higher than the normal resolution. The calculated cycle number Num2 (Num_max>Num2>Num3>0) is set to the object cycle number Num0 (step SB5).

When the characteristic signal G9 indicates that the strength of the input signal G1 is not smaller than the normal strength, the cycle number is the normal cycle number Num3. In this case, the Num3 is set to the object cycle number Num0 (step SB6).

In this way, when the object cycle number is set based on the characteristic signal G9, the control signal generation unit 20 generates the control signal G10 including the object cycle number (step SB7). The generated control signal G10 is outputted to the SAR 28 and the DAC 30.

When the DAC 30 and the SAR 28 receive the control signal G10, the DAC 30 and the SAR 28 set an execution completion cycle number Num to "1" (step SB8).

In step SB9, it is determined whether the current cycle number Num is "1", the process proceeds to step SB10 when the execution completion cycle number Num is "1" and the process proceeds to step SB11 when the execution completion cycle number Num is not "1".

When the execution completion cycle number Num is "1", a first bit that is the most significant bit (MSB) of the SAR 28 is set to "1" in synchronization with the clock signal G22 for comparison (step SB10) and the register signal G21 corresponding (step SB10) to this setting is outputted to the DAC 30 (step SB14).

Because the content of the inputted register signal G21 indicates that the MSB is "1", the DAC 30 performs the digital-to-analog conversion of a value (0.5V) that is a half of the full scale (1V) and outputs it to the comparator 32 as the reference signal G23.

On the other hand, in step SB9, when the execution completion cycle number Num is not "1", the SAR 28 performs a magnitude comparison between the reference signal G23 and the sampling signal G2 (step SB11).

When the reference signal G23 is smaller than the sampling signal G2, the value of the bit that is one bit higher than the current bit is held to "1" and the current bit is set to "1" (step SB12).

For example, in a case in which the current bit is a second bit, the first bit (MSB) is set to "1". Therefore, the first bit is held to "1" and the second bit is set to "1". As a result, the DAC 30 outputs the reference signal G3 whose value is 0.5V+ 0.25V to the comparator 32 (step SB14).

On the other hand, when it is determined that the reference signal G23 is greater than the sampling signal G2, the value of the bit that is one bit higher than the current bit is changed to "0" and the current bit is set to "1" (step SB13).

For example, in a case in which the current bit is a second bit, the first bit (MSB) has been set to "1". Therefore, the first bit is changed to "0" and the second bit is set to "1". As a result, the DAC 30 outputs the reference signal G3 which indicates the value of 0.25V to the comparator 32 (step SB14).

It is determined whether the current execution completion cycle number Num reaches the object cycle number Num0 (step SB15). When the current execution completion cycle number Num reaches the object cycle number Num0, the process proceeds to step SB16 and the output signal G8 that is converted into a digital form is outputted from the SAR 28. On the other hand, when the current execution completion cycle number Num does not reach the object cycle number Num0, the process proceeds to step SB17 and the execution completion cycle number Num is increased by one and the process returns to step SB9.

One cycle of the process is composed of the processes from step SB9 to step S17. This cycle is repeated by the object cycle number Num0 and whereby, the digital signal that is converted at the set resolution is outputted.

Figure 7:
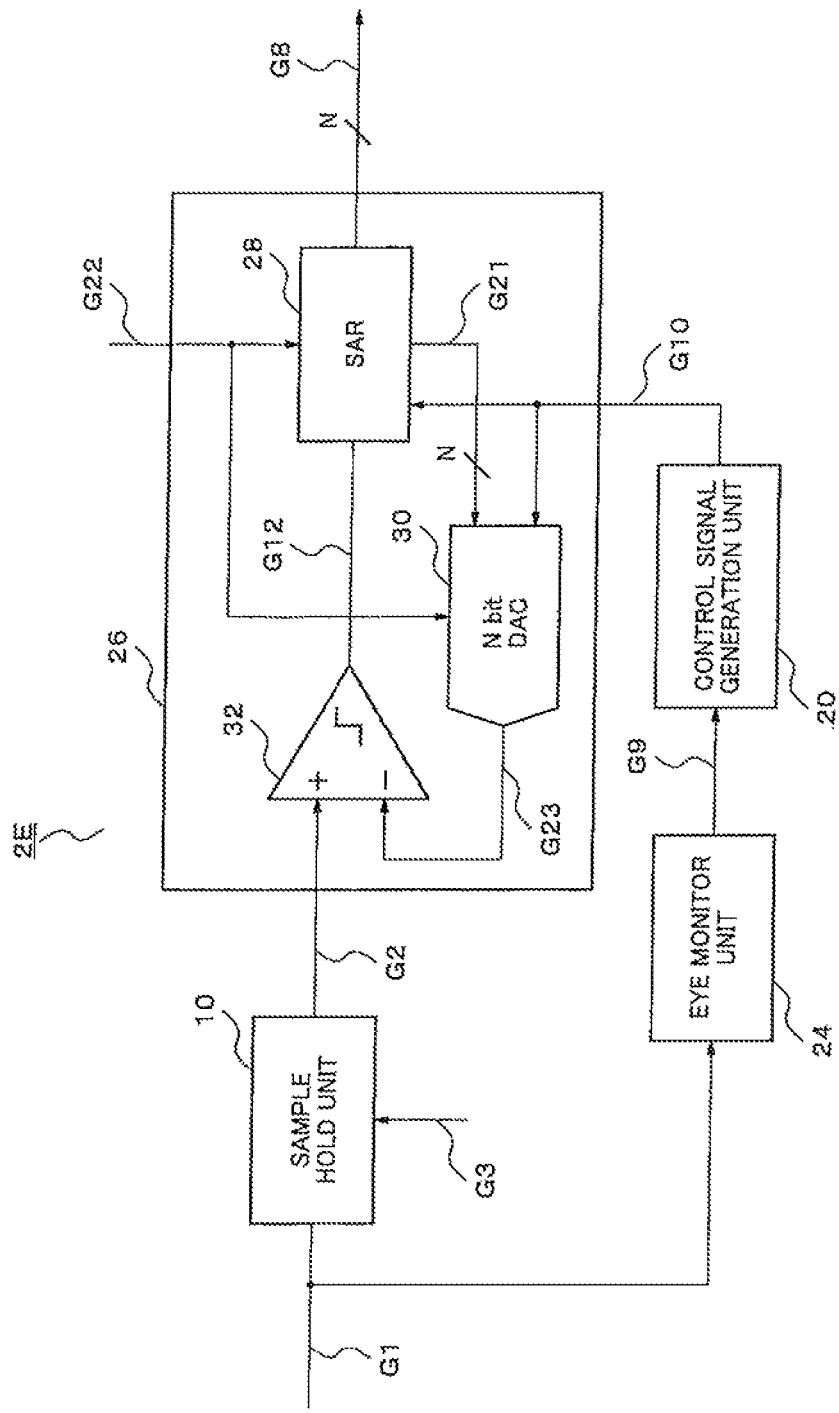
FIG. 7 is a block diagram of an analog-to-digital conversion device using an eye monitor unit according to a fourth exemplary embodiment.

Further, as shown in FIG. 7, the eye monitor unit 24 may be used instead of the received signal strength detection unit 22. In this case, the signal characteristic of the input signal is an amount of degradation in quality. When the amount of degradation in quality is large, the execution cycle number is increased so as to increase the resolution and when the amount of degradation in quality is small, the execution cycle number is decreased so as to lower the resolution.

As described above, because the execution cycle number Num is set according to the signal characteristic of the input signal and this execution cycle number Num is smaller than a maximum cycle number Num_max, the conversion into the digital signal can be performed at the resolution according to the signal characteristic of the analog signal that is a conversion object and the power consumption can be reduced at the time of the conversion.

Fifth Exemplary Embodiment

Figure 8:
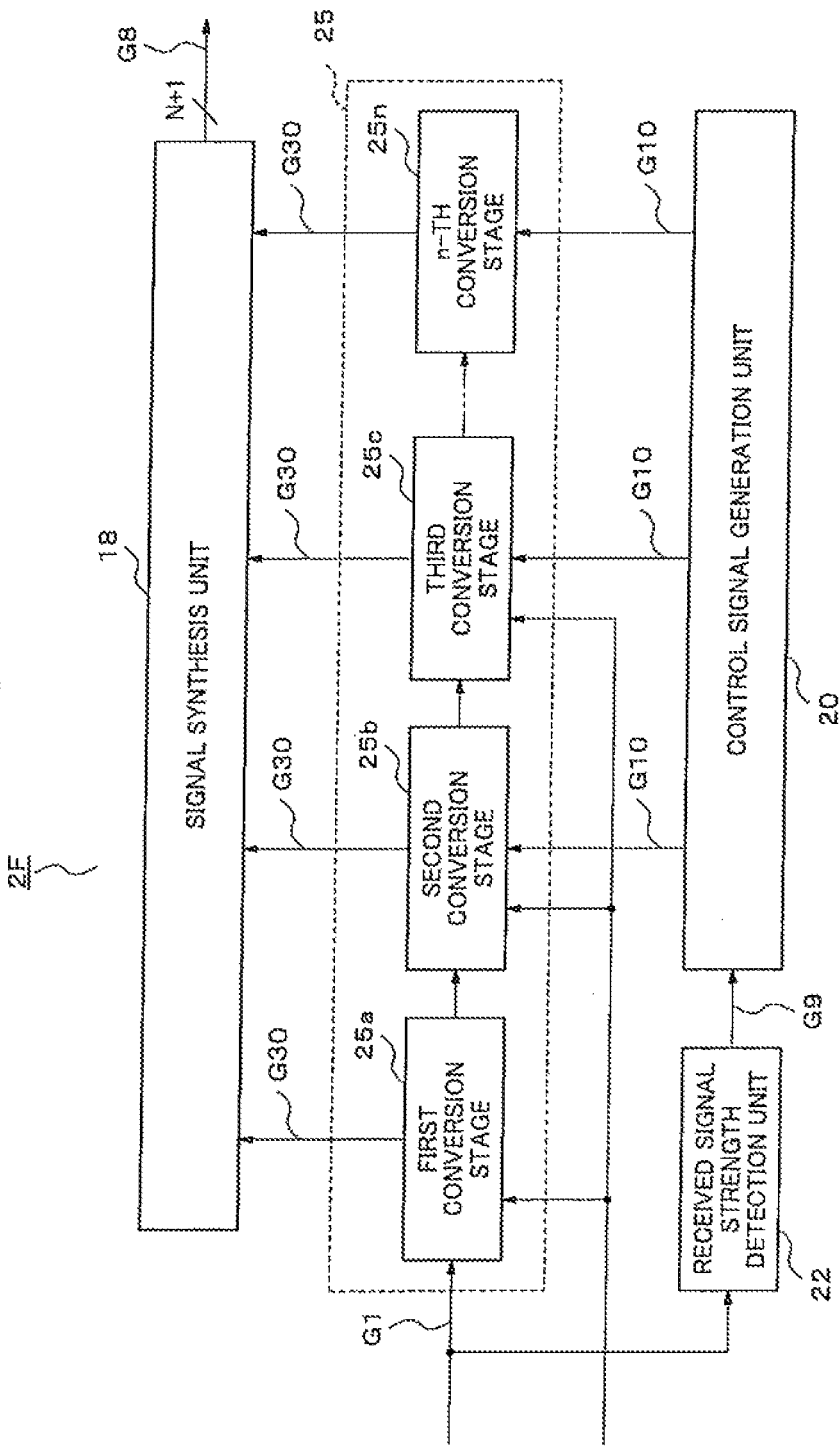
FIG. 8 is a block diagram of an analog-to-digital conversion device using a received signal strength detection unit according to a fifth exemplary embodiment of the present invention.

Next, a fifth exemplary embodiment of the present invention will be described. This exemplary embodiment relates to a pipeline analog-to-digital conversion device. FIG. 8 is a block diagram of an analog-to-digital conversion device 2E according to the fifth exemplary embodiment.

The analog-to-digital conversion device 2E includes a stage conversion unit 25 in which a first conversion stage 25a to an n-th conversion stage 25n, the number of which corresponds to the number of bits of the output signal G8, are connected in n-stage cascade, the signal synthesis unit 18, the control signal generation unit 20, and the received signal strength detection unit 22.

Further, the conversion stages from a second conversion stage 25b to an (n−1)th conversion stage 25(n−1) have the same configuration and operate in the same manner. Therefore, hereinafter, the conversion stage is described as a k-th conversion stage 25k.

Figure 9A:
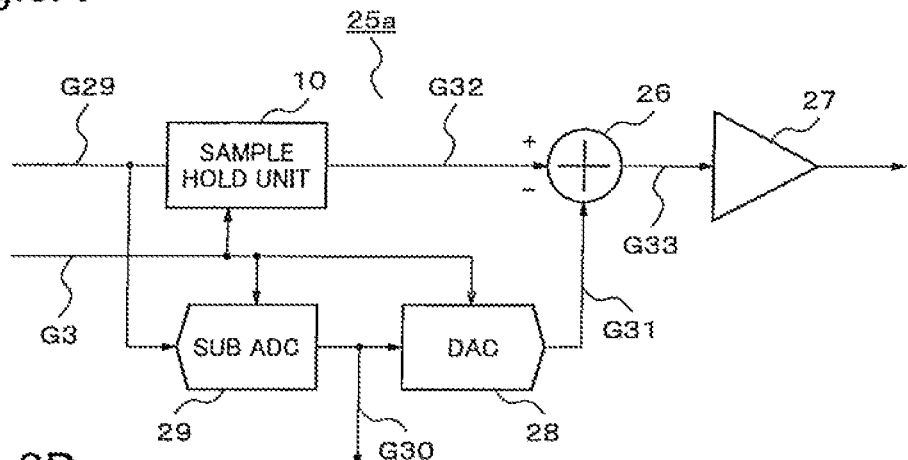
FIG. 9A is a block diagram of a first conversion stage in a parallel type analog-to-digital conversion device according to a fifth exemplary embodiment.
Figure 9B:
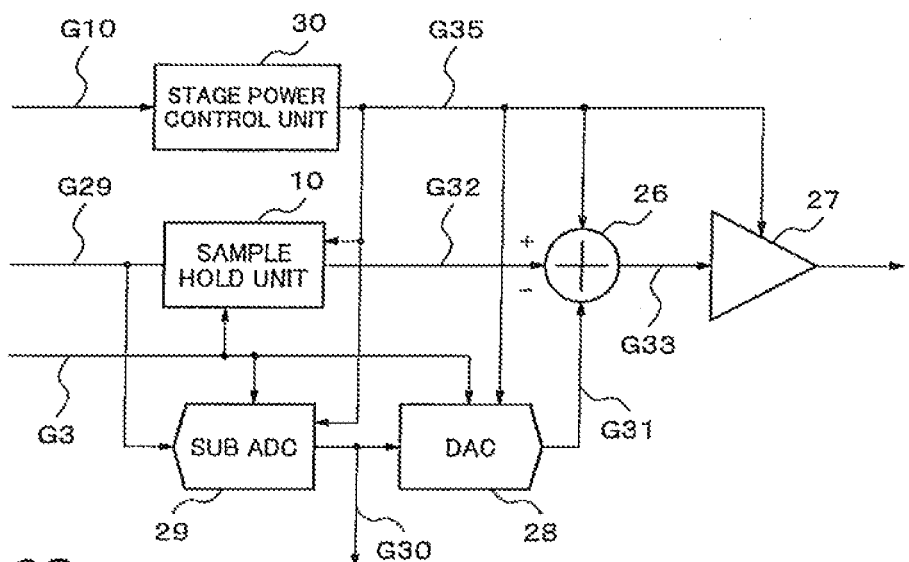
FIG. 9B is a block diagram of a k-th conversion stage in a parallel type analog-to-digital conversion device according to a fifth exemplary embodiment.
Figure 9C:
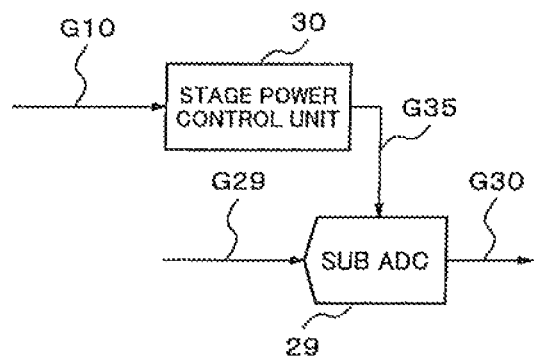
FIG. 9C is a block diagram of an n-th conversion stage in a parallel type analog-to-digital conversion device according to a fifth exemplary embodiment.

FIG. 9A is a block diagram of the first conversion stage 25a, FIG. 9B is a block diagram of the k-th conversion stage 25k, and FIG. 9C is a block diagram of the n-th conversion stage 25n. The first conversion stage 25a includes the sample hold unit 10, a subtracter 26, an amplifier 27, the DAC 28 and a sub ADC 29.

Further, the first conversion stage 25a always operates. Therefore, the control signal G10 is not inputted. For this reason, a stage power control unit 30 which is operated by the control signal G10 is not provided. The first conversion stage 25a is always operated. The reason for this is to avoid the inconvenience of the loss of the analog-to-digital conversion function in which the inputted analog signal is outputted without conversion when the first conversion stage 25a stops.

In contrast, the k-th conversion stage 25k includes the sample hold unit 10, the subtracter 26, the amplifier 27, the DAC 28, the sub ADC 29, and the stage power control unit 30. The n-th conversion stage 25n includes the sub ADC 29 and the stage power control unit 30.

Because the n-th conversion stage 25n is the last stage, this stage does not need to supply the signal to the subsequent conversion stage unlike the former conversion stage. For this reason, the n-th conversion stage 25n does not include the sample hold unit 10, the subtracter 26, the amplifier 27, and the DAC 28. The control signal G10 is inputted to the k-th conversion stage 25k and the n-th conversion stage 25n. The k-th conversion stage 25k and the n-th conversion stage 25n is operated or stopped based on this control signal G10.

The sample hold unit 10, the control signal generation unit 20, and the received signal strength detection unit 22 operate as described above. At this time, the control signal generation unit 20 sets the resolution based on the signal characteristic detected by the received signal strength detection unit 22 and specifies the conversion stage which is operated for performing the digital conversion at this resolution. By this, for example, the number of the conversion stages which are operated is increased when the high resolution is required and the number of the conversion stages which are operated is decreased when the low resolution is required.

Specifically, for example, in a case in which the conversion stages from the first conversion stage 25a to the j-th conversion stage 25j are operated as a normal setting, when the resolution is lowered, the conversion stages from the first conversion stage 25a to the j_1-th conversion stage 25j_1 (n>j_1>j) are operated.

On the other hand, when the resolution is increased, the conversion stages from the first conversion stage 25a to the j_2-th conversion stage 25j_2(j>j_2>1) are operated. Where, j, j_1, and j_2 satisfy n>j_1>j>j_2>1. At this time, the specific value of j_1 and j_2 is determined based on the characteristic signal.

The stage power control unit 30 is provided in the conversion stages 25b to 25n and controls the supply of power to the sample hold unit 10, the subtracter 26, the amplifier 27, the DAC 28, and the sub ADC 29 that are controlled by the stage power control unit 30 based on the control signal G10 from the control signal generation unit 20. Namely, when the control signal G10 has a content to instruct the stage power control unit 30 to stop the supply of power, the stage power control unit 30 does not supply the power to these.

On the other hand, when the control signal G10 has a content to instruct the stage power control unit 30 to supply the power, the stage power control unit 30 supplies the power to these. Because the sample hold unit 10, the subtracter 26, the amplifier 27, the DAC 28, and the sub ADC 29 stop when the supply of power is stopped, the power consumption is reduced.

The sub ADC 29 converts an inputted stage input signal G29 into 1.5-bit data and outputs the converted bit data to the signal synthesis unit 18 and the DAC 28 as a stage output signal G30.

The DAC 28 converts the stage output signal G30 from the sub ADC 29 into the analog signal and outputs this to the subtracter 26 as a signal G31 for subtraction. Further, the sample hold unit 10, the sub ADC 29, and the DAC 28 operate in synchronization with the clock signal G3.

The subtracter 26 subtracts the signal G31 for subtraction from a stage sampling signal G32 and outputs it to the amplifier 27 as a residual signal G33.

The amplifier 27 amplifies the residual signal G33 from the subtracter 26 and outputs it to the subsequent conversion stage. The signal outputted from the former conversion stage is the stage input signal G29 to the subsequent conversion stage. Where, the stage input signals G29 that are inputted to two successive conversion stages are analog signals whose values differ by a value corresponding to 1.5 bits from each other.

The signal synthesis unit 18 synthesizes the stage output signals G30 outputted by the conversion stages from the first conversion stage 25a to the n-th conversion stage 25n and outputs the output signal G8 that is the digital signal with N bit+1 obtained by performing the digital conversion of the input signal G1.

Figure 10:
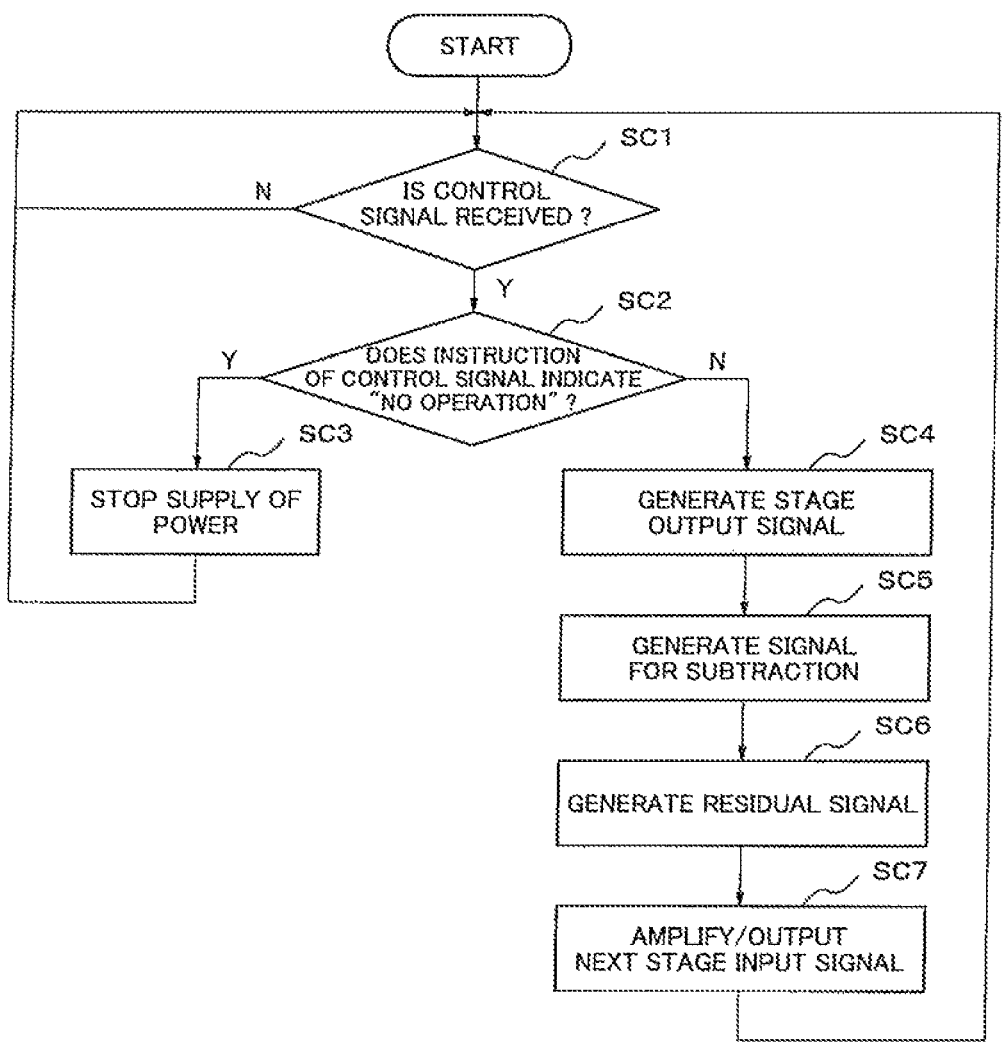
FIG. 10 is a flowchart of a k-th conversion stage in an analog-to-digital conversion device according to a fifth exemplary embodiment.

Next, the operation of the conversion stage will be described. In the explanation, the k-th conversion stage 25 is taken as an example. A peculiar point in the first conversion stage 25a and the n-th conversion stage 25n will be described in each case. FIG. 10 is a flowchart of the k-th conversion stage 25k.

First, the stage power control unit 30 of the k-th conversion stage 25k is waiting for the input of the control signal G10 (step SC1). When the control signal G10 is received, it is determined whether the instruction of the control signal G10 indicates "no operation" or "operation" (step SC2).

When the control signal G10 indicates "no operation", the stage power control unit 30 stops the supply of the power to the sample hold unit 10, the sub ADC 29, the DAC 28, the subtracter 26, and the amplifier 27 (step SC3). Further, because the control signal G10 is not inputted to the first conversion stage 25a and the stage power control unit 30 is not provided in it, the first conversion stage 25a is always in an operating state.

On the other hand, when the control signal G10 indicates "operation", the sub ADC 29 converts the stage input signal G29 into the 1.5-bit (=2 bits−1) data in synchronization with the clock signal and outputs the converted 1.5-bit data to the signal synthesis unit 18 and the DAC 28 as the stage output signal G30 (step SC4).

The DAC 28 converts the stage output signal G30 into the analog signal and outputs it to the subtracter 26 as the signal G31 for subtraction (step SC5).

The subtracter 26 subtracts the signal G31 for subtraction from the stage sampling signal G32 and outputs it to the amplifier 27 as the residual signal G33 (step SC6).

The amplifier 27 doubles the residual signal G33 and outputs it to the successive stage (step SC7). Further, because the sample hold unit 10, the subtracter 26, the amplifier 27, and the DAC 28 are not provided in the n-th conversion stage 25n, the processes of steps SC5 to SC7 are not performed by these.

By such configuration, a voltage range of the stage input signal that is inputted to each conversion stage can be set, for example, to a range of a voltage width that is the same as that of the reference voltage signal in the reference voltage generation unit described in the second exemplary embodiment.

Figure 11:
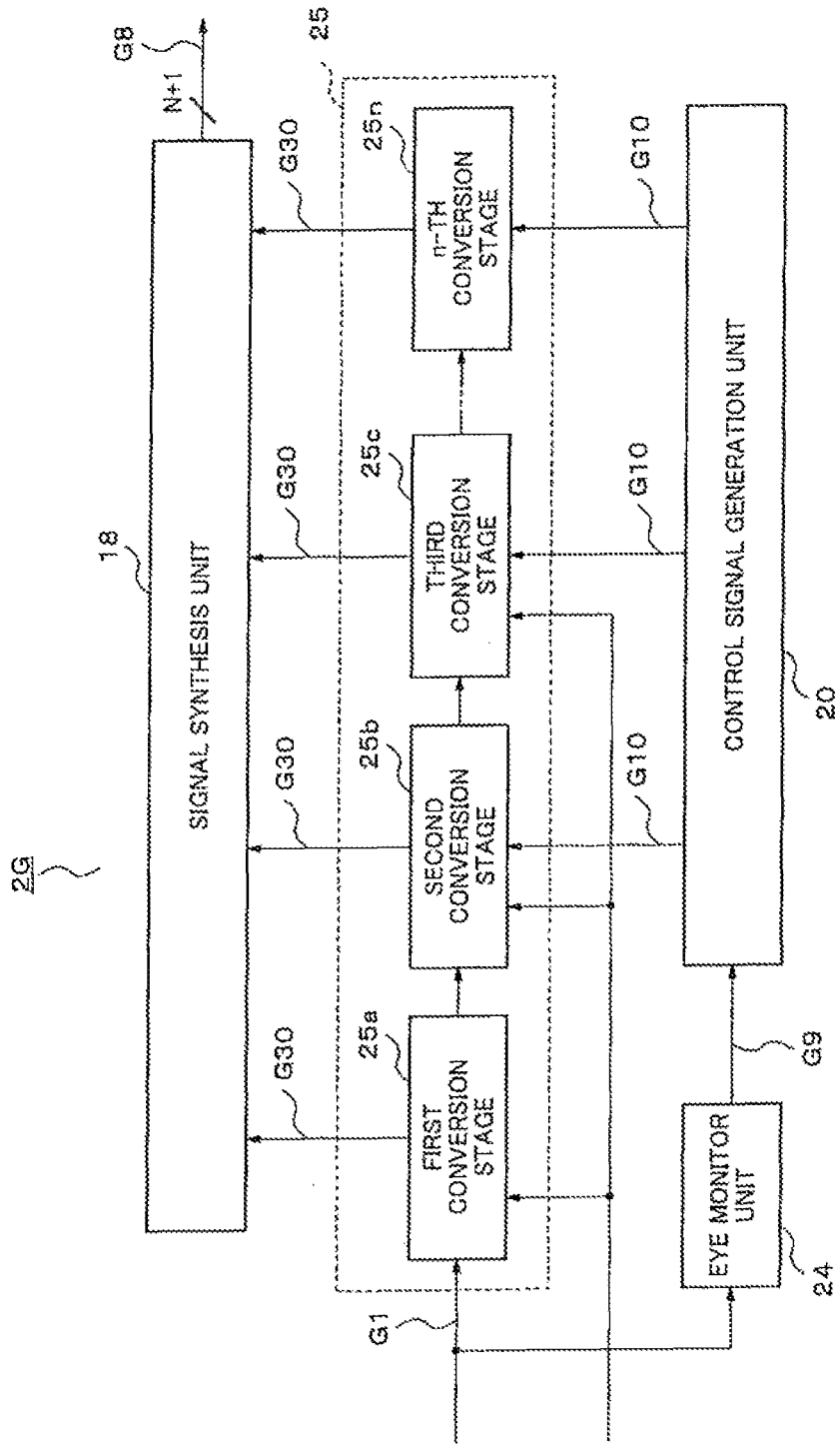
FIG. 11 is a block diagram of an analog-to-digital conversion device using an eye monitor unit according to a fifth exemplary embodiment.

Further, in the above-mentioned description, the received signal strength detection unit is provided for the setting of the resolution and the signal strength is detected as the signal characteristic. However, as shown in FIG. 11, the signal characteristic may be detected the eye monitor unit 24 that is provided instead of the received signal strength detection unit. Further, the operation of the eye monitor unit 24 is the same as the operation described in the third exemplary embodiment.

As described above, the resolution is set based on the detection result of the signal characteristic and only the conversion stages required for achieving this resolution are operated. Therefore, the power consumption can be reduced while maintaining the required resolution.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. An analog-to-digital conversion device which converts an analog input signal into a digital signal and output it comprising:
   a signal characteristic detection unit which operates and detects a predetermined characteristic of the input signal for every predetermined time;
   a control signal generation unit for setting a resolution based on the signal characteristic detected by the signal characteristic detection unit, generating a control signal that indicates only an operation required for performing the analog-to-digital conversion at the resolution, and outputting it; and
   an analog-to-digital conversion unit for restricting the operation based on the control signal and converting the input signal into the digital signal at the set resolution.

2. The analog-to-digital conversion device according to claim 1, wherein the analog-to-digital conversion unit comprises:
   a reference voltage generation unit for generating a plurality of reference voltage signals; and
   comparison means provided for each reference voltage signal for performing a magnitude comparison between the reference voltage signal and the input signal and outputting a comparison result signal in a digital form.

3. The analog-to-digital conversion device according to claim 2, wherein
   the comparison means operates or stops based on the control signal.

4. The analog-to-digital conversion device according to claim 3, wherein the comparison means comprises:
   a preamplifier for outputting a difference between the reference voltage signal and the input signal; and
   a comparator for performing a comparison between the outputs of the preamplifiers and outputting the comparison result signal.

5. The analog-to-digital conversion device according to claim 4, wherein
   the plurality of comparators output the comparison result signal in synchronization with a clock signal.

6. The analog-to-digital conversion device according to claim 1, wherein the analog-to-digital conversion unit comprises:
   a successive approximation register in which a plurality of register values are stored and which outputs a register signal corresponding to the register values and a digital-to-analog converter which converts the register signal into an analog signal and outputs it as the reference voltage signal; and
   a comparator which compares the input signal with the reference voltage signal and outputs the comparison result signal, wherein the comparison result signal is inputted to the successive approximation register, the register value is set based on the comparison result signal, the register signal is outputted and whereby, a cycle of data processing performed by the successive approximation register, the digital-to-analog converter, and the comparator is performed according to the resolution.

7. The analog-to-digital conversion device according to claim 6, wherein
   the analog-to-digital conversion device is characterized in that the control signal generation unit specifies the number of cycles to be performed.

8. The analog-to-digital conversion device according to claim 1, wherein
   in the analog-to-digital conversion unit, a plurality of conversion stages which convert the input signal into the digital signal for each predetermined bit are connected in cascade and at least one or more conversion stages are separately operated or stopped based on the control signal.

9. The analog-to-digital conversion device according to claim 8, wherein the conversion stage comprises:
   a sub-analog-to-digital converter for converting the digital signal with a predetermined bit into the analog signal and outputting it as a stage output signal;
   a digital-to-analog converter for converting the stage output signal into the analog signal, generating a signal for subtraction, and outputting it;
   a subtracter for subtracting the signal for subtraction from the input signal; and
   a stage power control unit for supplying a power or stopping the supply of power to the sub-analog-to-digital converter, the digital-to-analog converter, and the subtracter based on the control signal.

10. The analog-to-digital conversion device according to claim 1, wherein
    the control signal generation unit includes a received signal strength detection unit for detecting a signal strength of the input signal as the signal characteristic.

11. The analog-to-digital conversion device according to claim 1, wherein the control signal generation unit includes an eye monitor unit for detecting an amount of degradation of the input signal as the signal characteristic.

12. An analog-to-digital conversion method for converting an analog input signal into a digital signal comprising:
- a signal characteristic detection step for detecting a predetermined characteristic of the input signal for every predetermined time;
- a control signal generation step for setting a resolution based on the signal characteristic detected by the signal characteristic detection step, generating a control signal that indicates only an operation required for performing the analog-to-digital conversion at the resolution, and outputting it; and
- an analog-to-digital conversion step of restricting the operation based on the control signal and converting the input signal into the digital signal at the set resolution.

13. The analog-to-digital conversion method according to claim 12, wherein the analog-to-digital conversion step further comprises:
- a reference voltage generation step for generating a plurality of reference voltage signals; and
- a comparison step for performing a magnitude comparison between the reference voltage signal and the input signal and outputting a comparison result signal in a digital form that is provided correspondingly for each reference voltage signal.

14. The analog-to-digital conversion method according to claim 13, wherein
the comparison step includes an operation step and a stop step that are controlled based on the control signal.

15. The analog-to-digital conversion method according to claim 12, wherein the analog-to-digital conversion step comprises:
- a register signal output step for storing a register value in a successive approximation register and outputting a register signal corresponding to the register value;
- a digital-to-analog conversion step for converting the register signal into the analog signal and outputting it as a reference voltage signal; and
- a comparison result signal output step for comparing the input signal with the reference voltage signal and outputting a comparison result signal; wherein
the comparison result signal is inputted to the successive approximation register, the register value is set based on the comparison result signal, the register signal is outputted, a process that is composed of the register signal output step, the digital-to-analog conversion step, and the comparison result signal output step is defined as one cycle of the process, and this cycle is repeated according to the resolution.

16. The analog-to-digital conversion method according to claim 15, wherein
the control signal generation step includes a step of specifying the number of cycles to be performed.

17. The analog-to-digital conversion method according to claim 12, wherein
the analog-to-digital conversion step includes a stage conversion step of separately operating or stopping at least one or more conversion stages among a plurality of conversion stages in which the input signal is converted into the digital signal for each predetermined bit based on the control signal.

18. The analog-to-digital conversion method according to claim 17, wherein the stage conversion step comprises:
- a sub-analog-to-digital conversion step for converting the digital signal with a predetermined bit into the analog signal and outputting it as a stage output signal;
- a digital-to-analog conversion step for converting the stage output signal into the analog signal, generating a signal for subtraction, and outputting it;
- a subtraction step for subtracting the signal for subtraction from the input signal; and
- a stage operation/stop control step for controlling execution of the sub-analog-to-digital conversion step, the digital-to-analog conversion step, and the subtraction step based on the control signal.

19. The analog-to-digital conversion method according to claim 12, wherein
the signal strength of the input signal is detected as the signal characteristic by the control signal generation step.

20. The analog-to-digital conversion method according to claim 12, wherein
the amount of degradation of the input signal is detected as the signal characteristic by the control signal generation step.

* * * * *